United States Patent
Yamada

(10) Patent No.: US 9,754,722 B2
(45) Date of Patent: Sep. 5, 2017

(54) CAPACITOR, CAPACITOR MOUNTING STRUCTURE, AND TAPED ELECTRONIC COMPONENT SERIES

(71) Applicant: Murata Manufacturing Co., Ltd., Nagaokakyo-shi, Kyoto-fu (JP)

(72) Inventor: Tadateru Yamada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/403,207

(22) Filed: Jan. 11, 2017

(65) Prior Publication Data

US 2017/0125168 A1    May 4, 2017

Related U.S. Application Data

(63) Continuation of application No. 14/532,118, filed on Nov. 4, 2014, now Pat. No. 9,576,727.

(30) Foreign Application Priority Data

Nov. 5, 2013  (JP) .................................. 2013-229162
Mar. 20, 2014  (JP) .................................. 2014-057592

(51) Int. Cl.
| | | |
|---|---|---|
| *H05K 1/16* | (2006.01) | |
| *H01G 4/30* | (2006.01) | |
| *H01G 4/12* | (2006.01) | |
| *H05K 1/18* | (2006.01) | |
| *H01G 4/012* | (2006.01) | |
| *H01G 4/248* | (2006.01) | |

(52) U.S. Cl.
CPC ............... *H01G 4/30* (2013.01); *H01G 4/012* (2013.01); *H01G 4/1227* (2013.01); *H01G 4/248* (2013.01); *H05K 1/181* (2013.01); *H05K 2201/10015* (2013.01); *H05K 2201/10681* (2013.01)

(58) Field of Classification Search
CPC    H01G 2/065; H01G 4/30; H01G 4/12; H05K 1/09; H05K 1/181
USPC ................. 174/250, 251, 253, 255–258, 260
See application file for complete search history.

(56) References Cited

U.S. PATENT DOCUMENTS

| | | | |
|---|---|---|---|
| 8,804,367 B2 * | 8/2014 | Park .......................... | H01G 4/12 |
| | | | 361/782 |
| 9,048,026 B2 * | 6/2015 | Ahn ...................... | H05K 3/3442 |
| 2013/0038979 A1 * | 2/2013 | Togashi ................... | H01G 4/30 |
| | | | 361/301.4 |

FOREIGN PATENT DOCUMENTS

JP    H06-349669    * 12/1994

OTHER PUBLICATIONS

Yamada, "Capacitor, Capacitor Mounting Structure, and Taped Electronic Component Series", U.S. Appl. No. 14/532,118, filed Nov. 4, 2014.

* cited by examiner

*Primary Examiner* — Tremesha S Willis
(74) *Attorney, Agent, or Firm* — Keating & Bennett, LLP

(57) ABSTRACT

In a capacitor main body, a dimension along the thickness direction of a first region where a first inner electrode and a second inner electrode are provided is t1, a dimension along the thickness direction of a second region that is positioned on the side of a first main surface relative to the first region is t2, and a dimension along the thickness direction of a third region that is positioned on the side of a second main surface relative to the first region is t3. A condition of t2/t1>about 0.15 and a condition of t3/t1>about 0.15 are satisfied.

17 Claims, 10 Drawing Sheets

CAPACITOR, CAPACITOR MOUNTING STRUCTURE, AND TAPED ELECTRONIC COMPONENT SERIES

BACKGROUND OF THE INVENTION

1. Field of the Invention

The present invention relates to capacitors, capacitor mounting structures, and taped electronic component series.

2. Description of the Related Art

At present, capacitors such as multilayer ceramic capacitors are used in various types of electronic components.

When a voltage applied to a multilayer ceramic capacitor varies, the multilayer ceramic capacitor is distorted in some cases. The distortion of the multilayer ceramic capacitor is transferred to a circuit board on which the multilayer ceramic capacitor is mounted, via a bonding material. This causes the circuit board to vibrate. In a case where a vibration frequency of the circuit board is about 20 Hz to 20 kHz, the vibration of the circuit board is recognized as a sound. A sound generated at this audible frequency band is called "acoustic noise". This acoustic noise has been a problem in various types of electronic apparatuses such as television sets, personal computers, mobile communication terminals such as cellular phones, and so on.

Japanese Unexamined Patent Application Publication No. 2013-38332 discloses that acoustic noise can be suppressed by making, in a capacitor region where a first inner electrode and a second inner electrode oppose each other, the thickness of a suppression region located on one side of the capacitor region be larger than the thickness of a suppression region located on the other side thereof.

It has been desired to further suppress acoustic noise in capacitor mounting structures.

SUMMARY OF THE INVENTION

Accordingly, preferred embodiments of the present invention significantly reduces or prevents acoustic noise in capacitor mounting structures.

A capacitor according to an aspect of various preferred embodiments of the present invention includes a capacitor main body, a first inner electrode, and a second inner electrode. The capacitor main body includes a first main surface, a second main surface, a first side surface, a second side surface, a first end surface, and a second end surface. The first main surface and the second main surface extend along a longitudinal direction and a width direction. The first side surface and the second side surface extend along the longitudinal direction and a thickness direction. The first end surface and the second end surface extend along the width direction and the thickness direction. The first inner electrode and the second inner electrode are provided in the capacitor main body. The first inner electrode and the second inner electrode oppose each other via a ceramic section. The ceramic section includes ferroelectric ceramics. In the capacitor main body, a dimension along the thickness direction of a first region where the first and second inner electrodes are provided is taken as $t1$. In the capacitor main body, a dimension along the thickness direction of a second region that is positioned on the first main surface side relative to the first region is taken as $t2$. In the capacitor main body, a dimension along the thickness direction of a third region that is positioned on the second main surface side relative to the first region is taken as $t3$. A condition of $t2/t1>$about 0.07 and a condition of $t3/t1>$about 0.07 are preferably satisfied.

In the capacitor according to another aspect of various preferred embodiments of the present invention, in the case where a shortest distance along the width direction from a portion where both the first and second inner electrodes of the capacitor main body are provided to the first side surface is taken as $w2$, and a shortest distance along the width direction from the portion where both the first and second inner electrodes of the capacitor main body are provided to the second side surface is taken as $w3$, it is preferable for $t2$ and $t3$ to be greater than $w2$ and $w3$, respectively.

In the capacitor according to another aspect of various preferred embodiments of the present invention, it is preferable for a condition of about $2.0>t3/t2>$about $0.5$ to be satisfied.

In the capacitor according to another aspect of various preferred embodiments of the present invention, it is preferable for $t2$ and $t3$ to be equal or substantially equal to each other.

In the capacitor according to another aspect of various preferred embodiments of the present invention, it is preferable for the first inner electrode and the second inner electrode to oppose each other in the thickness direction.

A capacitor mounting structure according to another aspect of various preferred embodiments of the present invention includes the capacitor according to the aforementioned aspects of various preferred embodiments of the present invention and a mounting board on which the capacitor is mounted. In the structure, the capacitor is mounted so that the second main surface opposes the mounting board.

A taped electronic component series according to another aspect of various preferred embodiments of the present invention includes the capacitor according to the aforementioned aspects of various preferred embodiments of the present invention, and a tape including a plurality of recesses that are arranged along the longitudinal direction and in each of which the capacitor is accommodated. The capacitor is disposed so that the second main surface thereof opposes a bottom surface of the recess.

According to the various aspects of various preferred embodiments of the present invention, acoustic noise is significantly reduced or prevented in capacitor mounting structures.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
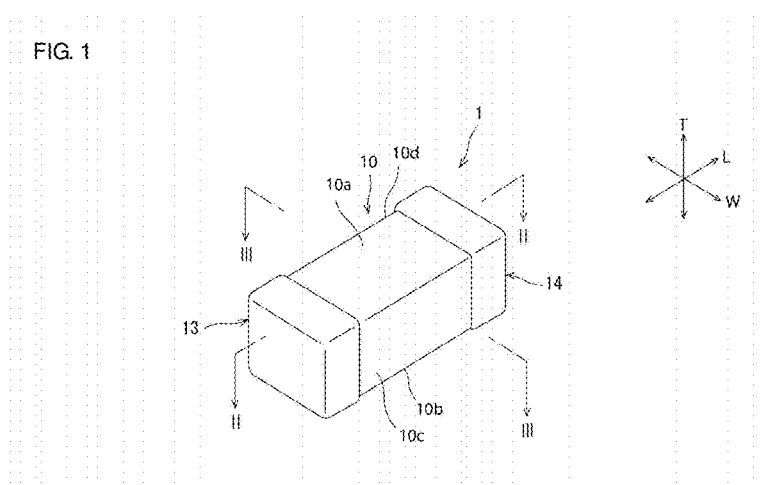
FIG. 1 is a schematic perspective view of a capacitor according to a preferred embodiment of the present invention.

Hereinafter, examples of various preferred embodiments of the present invention will be described. Note that, however, the preferred embodiments described below are merely examples. The present invention is not intended to be limited to the following preferred embodiments in any way.

Further, in the drawings referred to in the description of preferred embodiments and the like, members having functions that are identical or substantially identical are given identical reference numerals. The drawings referred to in the description of preferred embodiments and the like are schematic depictions, and as such the ratios of dimensions and so on of objects depicted in the drawings may differ from the actual ratios of dimensions and so on of those objects. The ratios of dimensions and so on of the objects may differ from drawing to drawing as well. The specific ratios of dimensions and so on of objects should be understood in consideration of the following descriptions.

Figure 2:
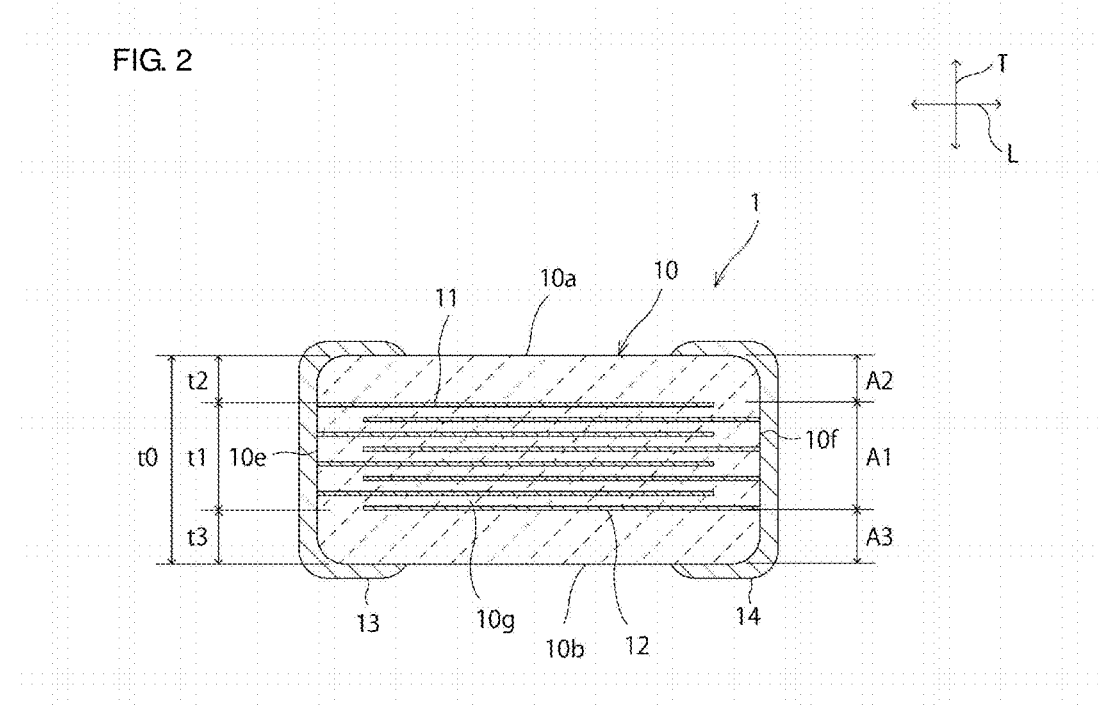
FIG. 2 is a schematic cross-sectional view taken along a line II-II in FIG. 1.
Figure 3:
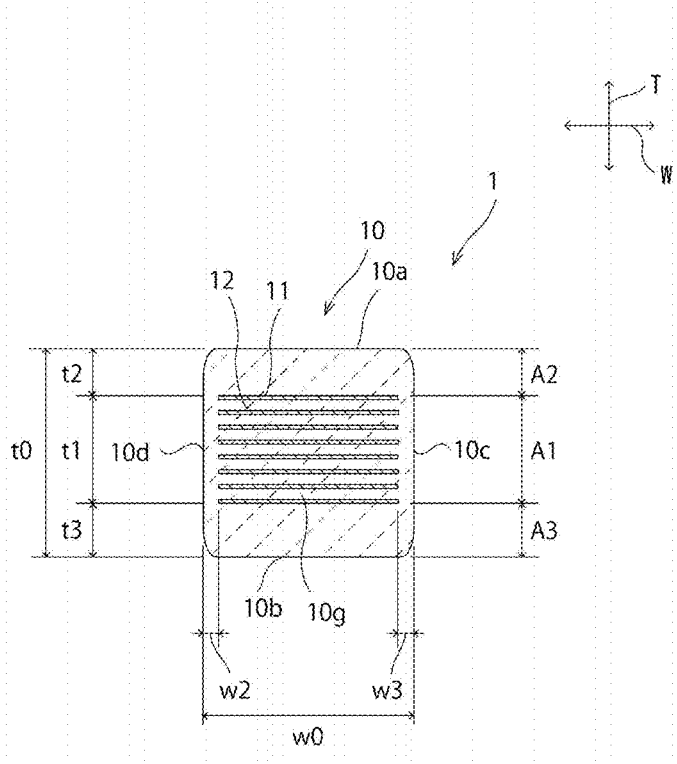
FIG. 3 is a schematic cross-sectional view taken along a line III-III in FIG. 1.

FIG. 1 is a schematic perspective view of a capacitor according to a preferred embodiment of the present invention. FIG. 2 is a schematic cross-sectional view taken along a line II-II in FIG. 1. FIG. 3 is a schematic cross-sectional view taken along a line III-III in FIG. 1.

A capacitor 1 illustrated in FIGS. 1 through 3 is a multilayer ceramic capacitor. Various preferred embodiments of the present invention can be preferably applied to the capacitor 1 having large electrostatic capacity that is likely to cause the generation of acoustic noise, in particular, preferably applied to the capacitor 1 having electrostatic capacity of no less than about 1 µF, about 10 µF, and so on.

The capacitor 1 includes a capacitor main body 10. The capacitor main body 10 preferably has a substantially parallelepiped shape. Assume that this substantially parallelepiped shape includes, in addition to a parallelepiped, a parallelepiped whose corners, ridge lines, and so on are chamfered, rounded, and so on.

The capacitor main body 10 includes a first main surface 10a, a second main surface 10b, a first side surface 10c, a second side surface 10d, a first end surface 10e, and a second end surface 10f (first and second end surfaces 10e and 10f can be seen in FIG. 2). The first and second main surfaces 10a and 10b both extend along a longitudinal direction L and a width direction W. The longitudinal direction L and the width direction W are perpendicular or substantially perpendicular to each other. The first and second side surfaces 10c and 10d both extend in the longitudinal direction L and a thickness direction T. The thickness direction T is perpendicular or substantially perpendicular to both the longitudinal direction L and the width direction W. The first and second end surfaces 10e and 10f both extend in the width direction W and the thickness direction T.

It is preferable for the dimension of the capacitor main body 10 along the longitudinal direction L to be about 0.6 mm to about 1.8 mm, for example. It is preferable for the dimension of the capacitor main body 10 along the width direction W to be about 0.3 mm to about 1.0 mm, for example. It is preferable for the dimension of the capacitor main body 10 along the thickness direction T to be about 0.3 mm to about 1.2 mm, for example.

The capacitor main body 10 is preferably configured with ferroelectric ceramics so as to obtain large electrostatic capacity. As specific examples of dielectric ceramics, $BaTiO_3$, $CaTiO_3$, $SrTiO_3$, and so on are capable of being used. Based on the characteristics that the capacitor 1 is required to have, accessory components such as Mn compounds, Mg compounds, Si compounds, Fe compounds, Cr compounds, Co compounds, Ni compounds, rare earth compounds, and so on, for example, may be appropriately added to the capacitor main body 10. It is preferable for relative permittivity of the ferroelectric ceramics to be no less than about 2000, and more preferable to be no less than about 3000, for example. In this case, electrostatic capacity of no less than about 1 µF, about 10 µF, or the like is capable of being realized within the above-mentioned dimensions of the capacitor main body 10. Because acoustic noise is likely to be generated in the capacitor 1 having been discussed so far, various preferred embodiments of the present invention are preferably applied thereto.

In the case where a Mn compound is added to the ferroelectric ceramics, it is preferable for the content of Mn in the dielectric ceramics to be no more than about 0.5 mol part with respect to $BaTiO_3$ of 100 mol part, and more preferable to be no more than about 0.2 mol part, for example. In order to improve reliability of the capacitor 1, it is preferable for the Mn compound to be no less than about 0.05 mol part, for example.

As shown in FIGS. 2 and 3, there are provided a plurality of first inner electrodes 11 and a plurality of second inner electrodes 12 inside the capacitor main body 10. The first inner electrode 11 and the second inner electrode 12 oppose each other via a ceramic section 10g. In the present preferred embodiment, the first inner electrodes 11 and the second inner electrodes 12 are alternately provided along the thickness direction T. The first inner electrodes 11 and the second inner electrodes 12 oppose each other via the ceramic sections 10g in the thickness direction T. However, the present invention is not intended to be limited to this configuration. In the present invention, the first inner electrodes and the second inner electrodes may oppose each other in the width direction or in the longitudinal direction, for example.

Various preferred embodiments of the present invention are preferably applicable, in particular, to a capacitor in which no less than 350 sheets of ceramic sections 10g are laminated while being sandwiched between the first inner electrodes 11 and the second inner electrodes 12. In other words, it is preferable for the number of the first and second inner electrodes 11 and 12 to be no less than 350 in total. In order to encompass no less than 350 sheets of ceramic sections 10g in the capacitor main body with a limited thickness, it is preferable for the thickness of the ceramic section 10g to be no more than about 1 µm, for example. In the case where the thickness of the ceramic section 10g is no more than about 1 µm, acoustic noise is likely to be generated because electrostatic capacity per unit area in a surface of the ceramic section 10g perpendicular or substantially perpendicular to the thickness direction T becomes larger. Accordingly, various preferred embodiments of the present invention are preferably applicable to the capacitor 1 whose electrostatic capacity is no less than about 1 µF and whose ceramic section 10g is no more than about 1 µm in thickness, as well as the capacitor 1 whose electrostatic capacity is no less than about 10 µF and whose ceramic section 10g is no more than about 1 µm in thickness, for example.

The first inner electrodes 11 are provided along the longitudinal direction L and the width direction W. The first inner electrodes 11 extend to the first end surface 10e, but do not extend to any of the first and second main surfaces 10a and 10b, the first and second side surfaces 10c and 10d, and the second end surface 10f.

The second inner electrodes 12 are provided along the longitudinal direction L and the width direction W. The second inner electrodes 12 extend to the second end surface 10f, but do not extend to any of the first and second main surfaces 10a and 10b, the first and second side surfaces 10c and 10d, and the first end surface 10e.

The first inner electrodes 11 and the second inner electrodes 12 can be individually configured with at least one type of material such as Pt, Au, Ag, Cu, Ni, Cr, or the like, for example.

A first outer electrode 13 is provided on the first end surface 10e. The first outer electrode 13 extends from an area on the first end surface 10e onto the first and second main surfaces 10a, 10b and the first and second side surfaces 10c, 10d. The first external electrode 13 is connected with the first inner electrodes 11 at the first end surface 10e.

A second outer electrode 14 is provided on the second end surface 10f. The second outer electrode 14 extends from a portion on the second end surface 10f onto the first and second main surfaces 10a, 10b and the first and second side surfaces 10c, 10d. The second external electrode 14 is connected with the second inner electrodes 12 at the second end surface 10f.

The first outer electrode 13 and the second outer electrode 14 can be individually configured with at least one type of material such as Pt, Au, Ag, Cu, Ni, Cr, or the like, for example.

Figure 4:
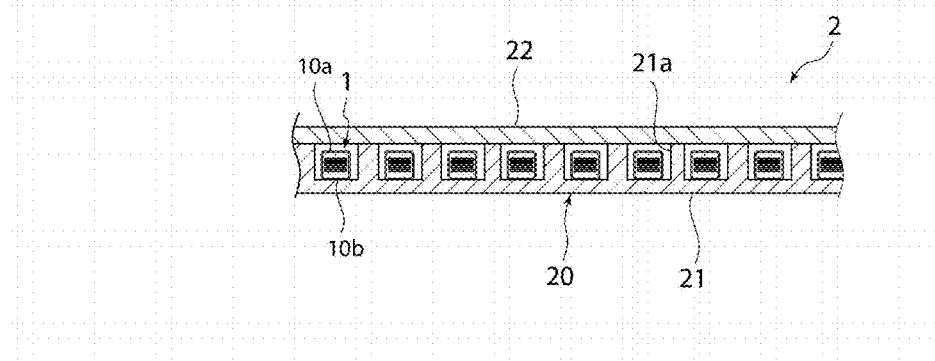
FIG. 4 is a schematic cross-sectional view of a taped electronic component series according to a preferred embodiment of the present invention.

FIG. 4 is a schematic cross-sectional view of a taped electronic component series according to a preferred embodiment of the present invention.

As shown in FIG. 4, a taped electronic component series 2 is a member in which the plurality of capacitors 1 are fixed by taping. The taped electronic component series 2 includes an elongated tape 20. The tape 20 includes an elongated carrier tape 21 and an elongated cover tape 22. The carrier tape 21 includes a plurality of recesses 21a provided at intervals along the longitudinal direction. The cover tape 22 is arranged on the carrier tape 21 so as to cover the plurality of recesses 21a. Each of the plurality of recesses 21a accommodates the capacitor 1. The plurality of capacitors 1 are disposed so that the second main surface 10b of each of the capacitors 1 faces the side of a bottom surface of the recess 21a. With this, the plurality of capacitors 1 are held with the first main surface 10a side thereof being bonded, and mounted with the second main surface 10b side thereof facing the side of a wiring board.

Figure 5:
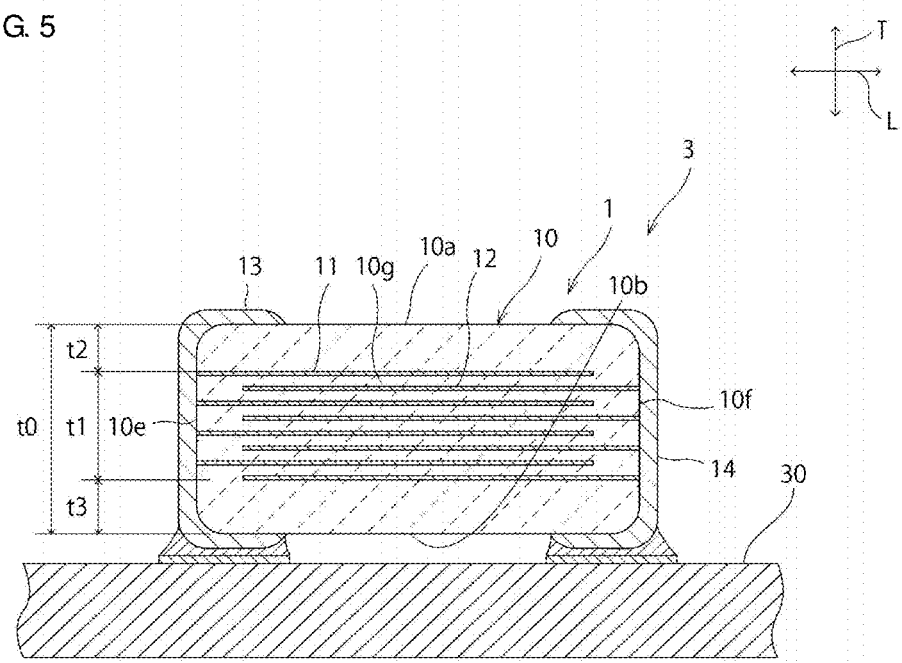
FIG. 5 is a schematic cross-sectional view of a capacitor mounting structure according to a preferred embodiment of the present invention.

FIG. 5 is a schematic cross-sectional view of a capacitor mounting structure according to a preferred embodiment of the present invention.

As shown in FIG. 5, a capacitor mounting structure 3 includes the capacitor 1 and a mounting board 30. The capacitor is mounted on the mounting board 30 so that the second main surface 10b faces the mounting board 30 side.

The first and second internal electrodes 11 and 12 are provided in a portion of the capacitor main body 10 in the thickness direction T. The capacitor main body 10 includes a first region A1 in which the first and second inner electrodes 11 and 12 are provided, a second region A2 positioned on the first main surface 10a side relative to the first region A1, and a third region A3 positioned on the second main surface 10b side relative to the first region A1. The first region A1 is called an effective region because this region exhibits the function of a capacitor. On the other hand, the second and third regions A2 and A3 are each called a non-effective region because these regions do not exhibit a function of a capacitor. Since the second and third regions A2 and A3 are thicker in dimension than a general capacitor having large electrostatic capacity, the second and third regions A2 and A3 are formed preferably by laminating a plurality of sheets of dielectric ceramics, each of which is thicker in dimension than the ceramic section 10g.

Here, as illustrated in FIG. 3, a dimension of the first region A1 along the thickness direction T is taken as t1. A dimension of the second region A2 along the thickness direction T is taken as t2. A dimension of the third region A3 along the thickness direction T is taken as t3. A distance along the width direction from a portion of the capacitor main body 10 where both the first and second inner electrodes 11 and 12 are provided to the first side surface 10c is taken as w2, and a distance along the width direction from a portion of the capacitor main body 10 where both the first and second inner electrodes 11 and 12 are provided to the second side surface 10d is taken as w3. It is preferable for t2 and t3 to be respectively larger than w2 and w3. In other words, it is preferable for t2 and t3 to be each larger than the greater one of w2 and w3. This is in contrast to a general case as follows. That is, in the case of a capacitor where the dimension of the capacitor main body 10 along the longitudinal direction L is no more than about 1.7 mm, the dimension thereof along the width direction W is no more than about 0.9 mm, and the electrostatic capacity is no less than about 1 µF, for example, w2 and w3 are generally made larger than t2 and t3 in order to ensure electrostatic capacity, moisture resistance, and manufacture precision.

Note that t2 and t3 can be measured in the following manner: that is, the capacitor 1 is polished so as to expose a cross section passing the center of the capacitor main body 10 and perpendicular or substantially perpendicular to the longitudinal direction L, then t2 and t3 can be measured at a central position of the cross section in the width direction W. Meanwhile, w2 and w3 can be measured in the following manner: that is, the capacitor 1 is polished so as to expose a cross section passing the center of the capacitor main body 10 and perpendicular or substantially perpendicular to the longitudinal direction L, then w2 and w3 can be measured at a central position of the cross section in the thickness direction T.

Conventionally, in a mounting structure where a capacitor is mounted on a mounting board so that the second main surface faces the mounting board, it is preferable for the dimension of thickness of the third region to be large from the standpoint of suppressing acoustic noise; on the other hand, it is assumed that the dimension of thickness of the second region has little influence on the acoustic noise. Meanwhile, from the standpoint of increasing electrostatic capacity of the capacitor, it is preferable for the dimension of thickness of the first region to be large. Accordingly, in order to suppress the reduction in electrostatic capacity of the capacitor and to suppress the acoustic noise by making the dimension of thickness of the third region larger and making the dimension of thickness of the second region smaller, design in which, of the second and third regions, only the third region is allowed to have a larger dimension of thickness, is generally used.

However, the inventors discovered through elaborate research that acoustic noise is further reduced or prevented by making the second region, in addition to the third region, thicker. As such, in the case of the capacitor 1 according to the present preferred embodiment, because a condition of t2/t1>about 0.07 and a condition of t3/t1>about 0.07 are both satisfied, acoustic noise is further reduced or prevented in the mounting structure 3 where the capacitor 1 is mounted.

The following can be conceived of in the conventional design concept discussed above: that is, of the thickness dimension that the non-effective regions are allowed to have depending on a required electrostatic capacity and the external dimensions of the capacitor, a possible maximum amount thereof is assigned to the third region, whereas a possible least amount thereof is assigned to the second region. However, as a result of the elaborate research, the inventors discovered that acoustic noise is not sufficiently suppressed if the thickness dimension of the second region is made excessively small. From the standpoint of sufficiently reducing or preventing the acoustic noise, it is preferable for a condition of t1/t0>about 0.6 and a condition of 1.2>t3/t2>about 0.8 to be satisfied in the case where a dimension of the capacitor main body 10 in the thickness direction T is taken as t0.

As in the past, if the design in which the thickness dimension t2 of the second region is small, and only the thickness dimension t3 of the third region is large is used, in order to make the first main surface oppose the mounting board, it is necessary to identify the first main surface and the second main surface, in other words, necessary to directionally-align the capacitor while identifying the upper and lower surfaces thereof. Because of this, as described in Japanese Unexamined Patent Application Publication No. 2013-38332, for example, the inner electrodes are needed to be exposed, or an identification mark needs to be added in a manner such that layers having different colors are provided on an outer surface of the capacitor, and so on. However, the addition of such identification mark has caused deterioration in characteristics, reliability, and so on of the capacitor, and complexity in the manufacture of the capacitor.

Meanwhile, in the case where both t2 and t3 satisfy the above conditions, acoustic noise is significantly reduced or prevented in any of the cases where the first main surface opposes the mounting board and where the second main surface opposes the mounting board. This makes it unnecessary to identify the first main surface and the second main surface, in other words, unnecessary to identify the upper and the lower surfaces when mounting the capacitors 1, arranging the capacitors in the tape 20, and so on. From this standpoint, it is preferable for t2 and t3 to satisfy a condition of 2.0>t3/t2>about 0.5, for example. In this case, there is only a slight difference in effectiveness of significantly reducing or preventing the acoustic noise between the case where the first main surface opposes the mounting board and the case where the second main surface opposes the mounting board. It is preferable for t2 and t3 to be equal or substantially equal to each other. The expression of "t2 and t3 to be equal or substantially equal to each other" means that t3 is about 0.9 to about 1.1 times t2, for example.

In order to further effectively reduce or prevent acoustic noise, it is further preferable for a condition of t2/t1>0.15 and a condition of t3/t1>0.15 to be satisfied. However, if t2/t1 and t3/t1 are too large, the electrostatic capacity of the capacitor 1 becomes too small in some cases. Alternatively, there is a case in which the mounting posture of the capacitor 1 becomes unstable because the thickness dimension t0 of the capacitors 1 becomes too large in an attempt to ensure the electrostatic capacity of the capacitor 1. As such, it is preferable for a condition of t2/t1<about 0.3 to be satisfied, for example. It is preferable as well for a condition of t3/t1<about 0.3, for example, to be satisfied.

In the case where a dimension of the capacitor main body 10 along the width direction W is taken as w0, it is preferable for t0 and w0 to be equal or substantially equal to each other. In this case, the posture stability of the capacitor 1 is improved at a time of mounting the capacitor 1 and after the mounting. At this time, mounting or taping of the capacitors 1, while identifying the main surfaces and the side surfaces or aligning the arrangement direction thereof, can be carried out with magnetic force making use of the surface direction of the inner electrodes. Here, the expression of "t0 and w0 to be equal or substantially equal to each other" means that w0 is about 0.9 to about 1.1 times t0, for example.

However, t0 may be larger than w0. In this case, such an advantage is achieved that the mounting or taping of the capacitors 1, while identifying the main surfaces and the side surfaces or aligning the arrangement direction thereof, can be carried out with ease due to difference in the outer shape.

Figure 6:
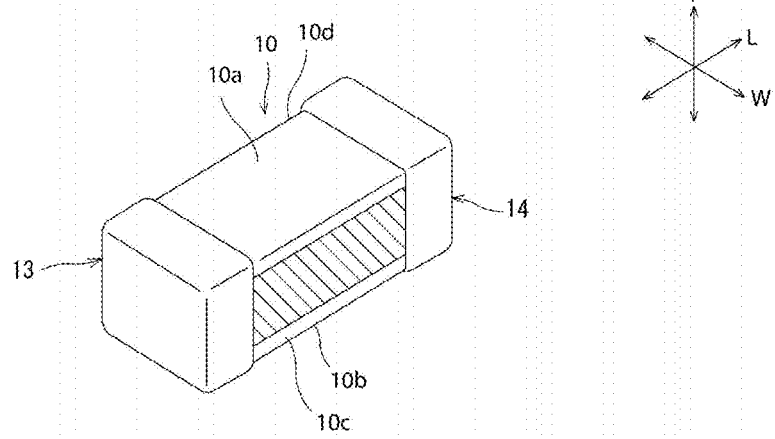
FIG. 6 is a schematic cross-sectional view of a capacitor according to a variation of a preferred embodiment of the present invention.

Depending on design conditions of the capacitor main body 10, the main surfaces and the side surfaces can be identified by difference in color depth between the main surfaces and the side surfaces. That is, in the case where at least one of W2 and w3 is smaller in comparison with t2 and t3, the inner electrodes 11 and 12 can be seen transparently from the side surfaces 10c and 10d, as shown in FIG. 6, and the color of the side surfaces 10c and 10d becomes deeper than that of the main surfaces. Alternatively, diffusion of inorganic components contained in the inner electrodes 11 and 12 makes the color of the side surfaces 10c and 10d deeper than that of the main surfaces 10a and 10b. Further alternatively, the color of side gap portions located between the side surfaces 10c, 10d and the effective region (first region A1) becomes deeper than that of the second and third regions A2 and A3 so that the color of the side surfaces 10c and 10d becomes deeper than that of the main surfaces 10a and 10b. The color of the side surfaces 10c and 10d becomes deep in a belt-shaped pattern extending in the longitudinal direction, corresponding to the inner electrodes 11 and 12. In FIG. 6, the portion having a deep color is indicated by hatching.

Figure 7:
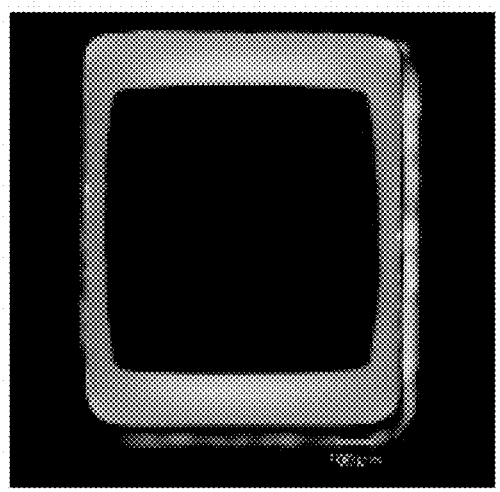
FIG. 7 is a photograph of a cross section of an actually manufactured capacitor, taken along the width direction and the thickness direction at the center of the capacitor in the longitudinal direction.

The following is considered to be a reason why the color of the side gap portions becomes deeper than that of the second and third regions A2 and A3. That is, because the side gap, which is thin, is close to the outer surface, pores in the side gap portions are likely to escape therefrom. In contrast, pores in the second and third regions A2 and A3, which are thick, are unlikely to escape therefrom and likely to remain. If the pores remain, color looks lighter. This is because irregular reflection of light is caused by the remaining pores. As shown in FIG. 7, the thicknesses w2 and w3 of the side gap portions are smaller than the thicknesses t2 and t3 of the second and third regions A2 and A3. Therefore, the remaining rate of the pores in the side gap portions is lower than that in the second and third regions A2 and A3, so that the color of the side surfaces, which are the outer surfaces of the side gap portions, becomes deeper and the color of the main surfaces, which are the outer surfaces of the second and third regions A2 and A3 becomes lighter.

This makes it possible to distinguish the side surfaces and the main surfaces by the difference in depth of colors.

In order to make clear the difference in depth of colors, it is preferable for at least one of w2 and w3 to be smaller by no less than about 10 μm in comparison with t2 and t3, and more preferable to be smaller by no less than about 30 μm, for example. Alternatively, it is preferable for at least one of w2 and w3 to be no more than about 80 μm, and more preferable to be no more than 60 μm, for example. Further alternatively, it is preferable to make the overall color of the dielectric ceramics lighter so as to make clear the difference in colors between the side surfaces and the main surfaces. The color of dielectric ceramics becomes lighter while changing from brown toward white as the content of Mn is smaller. This makes clear the difference in color. Accordingly, to identify the side surfaces and the main surfaces by the difference in colors, it is preferable for the content of Mn to be no more than about 0.5 mol part with respect to BaTiO₃ of 100 mol part, for example. It is preferable as well for the content of Mn to be no more than about 0.2 mol part with respect to BaTiO₃ of 100 mol part, for example.

In particular, in the case where the inner electrodes 11, 12 include Ni as a metal component in the main components, Ni diffuses into a dielectric material so that the difference in depth of color is made even more clear. Also in this case, the color of the side surfaces 10c and 10d is deeper toward black than the color of the main surfaces 10a and 10b.

The color of the side surfaces 10c and 10d and the color of the main surfaces 10a and 10b can be confirmed visually or under an optical microscope. Observing a cross section of the capacitor main body 10 under an optical microscope makes it possible to confirm the difference in color. The aforementioned remaining rate of the pores can be measured as an area ratio by observing a cross section of the capacitor main body 10 using a scanning electron microscope (SEM). Note that, however, there is a case in which a difference in remaining rate, which causes a difference in color, is included within a measurement error and cannot be recognized. A state of Ni distribution due to the diffusion can be confirmed from an element mapping image obtained through observation using an energy dispersive X-ray (EDX) analyzer device that is attached to the SEM.

The content of Mn can be measured in the following manner, for example. That is, forty multilayer ceramic capacitors 1 are respectively immersed in a sample bottle storing about 30 mL of a 0.2 mol/L adipic acid solution. The sample bottle is sealed and placed for about 120 hours in a standstill state at a temperature of about 85° C. After cooling, the multilayer ceramic capacitors 1 are taken out and washed by pure water until the adipic acid solution comes to the amount of 50 mL. Subsequently, ceramic components contained in 5 mL of an eluted liquid of the 50 mL adipic acid solution are quantified with an ICP emission spectrometry so as to obtain a total amount of eluted elements having been detected in a unit of μmol.

Figure 8:
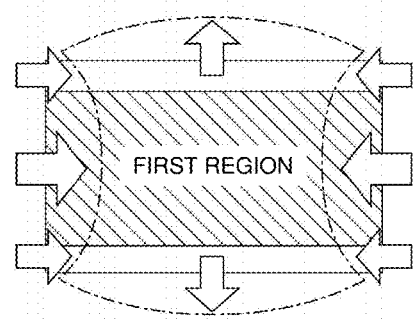
FIG. 8 is a diagram schematically illustrating expansion/contraction of a capacitor in the case where both t2/t1 and t3/t1 are smaller.
Figure 9:
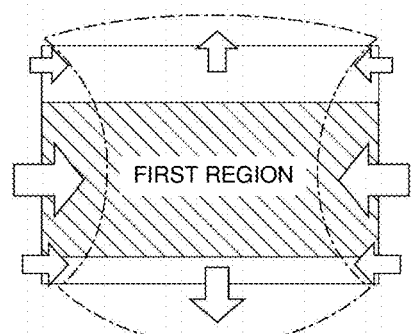
FIG. 9 is a diagram schematically illustrating expansion/contraction of a capacitor in the case where t2/t1 is larger while t3/t1 is smaller.
Figure 10:
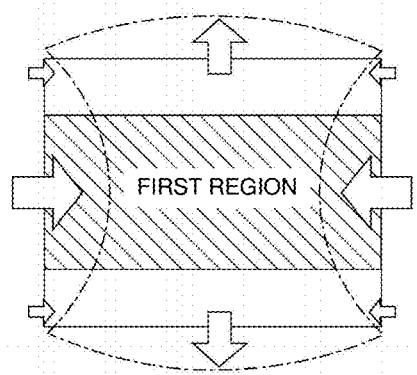
FIG. 10 is a diagram schematically illustrating expansion/contraction of a capacitor in the case where both t2/t1 and t3/t1 are larger.

The following can be considered to be a reason why a sound pressure of acoustic noise is further reduced or prevented when both t2/t1 and t3/t1 are made larger than when only one of them is made larger. As can be understood by comparing FIG. 8 with FIG. 9, in the case where only t2/t1 is made larger, a constraint force against the second region of the capacitor main body becomes strong. With this, on the first main surface, a force that acts on the exterior in the thickness direction T from the capacitor becomes weak; reacting to this, on the second main surface, a force that acts on the exterior in the thickness direction T from the capacitor becomes strong. As a result, since a force applied toward the capacitor in the longitudinal direction L on the second main surface becomes weak, a mounting board on which the capacitor is mounted is prevented from being deformed. On the other hand, in the case where only t3/t1 is made larger, a distance between the first region of the capacitor main body and the second main surface becomes longer. As such, the second main surface is distanced from the first region where distortion is generated, which makes the force applied toward the capacitor in the longitudinal direction L on the second main surface weak. As a result, the mounting board on which the capacitor is mounted is prevented from being deformed. As shown in FIG. 10, in the case where both t2/t1 and t3/t1 are made larger, the reaction to the constraint related to t2/t1 and the action caused by the thickness related to t3/t1 produce a synergistic effect, so that the force generated on the second main surface and applied toward the capacitor in the longitudinal direction L is further reduced by an amount which is larger than the sum of the amount in reduction of the force generated on the second main surface and applied toward the capacitor in the longitudinal direction L in the case of making only t2/t1 larger and the amount in reduction of the force generated on the second main surface and applied toward the capacitor in the longitudinal direction L. As such, it can be considered that the synergistic effect produced by making both t2/t1 and t3/t1 larger significantly reduces or prevents the acoustic noise effectively. It is to be noted that in the present specification, force applied to the main surfaces along the longitudinal direction L is evaluated in the manner in which a direction of force applied toward the center side of the capacitor in the longitudinal direction L is taken as a positive direction.

Hereinafter, various preferred embodiments of the present invention will be described in further detail based on specific examples. However, the present invention is not intended to be limited to the following examples in any way, and can be embodied by making appropriate modifications thereupon without departing from the spirit and scope of the present invention.

First Example

Under the following conditions, a capacitor mounting structure was manufactured. The sound pressure of acoustic noise of the manufactured capacitor mounting structure was measured under the following post-firing design conditions.

Capacitor Conditions

Dimensions of the capacitor main body: L dimension was about 1.10 mm, W dimension was about 0.59 mm, and T dimension was about 0.69 mm.

t1: about 520 μm
t2: about 85 μm
t3: about 85 μm
w2: about 55 μm
w3: about 55 μm
Number of ceramic sections: 391
Electrostatic capacity: about 4.7 μF Measurement Condition of Acoustic Noise Sound Pressure The capacitor was mounted on a mounting board using solder so as to manufacture a sample S. Next, the sample S was placed in an anechoic box of a measurement instrument, and an AC voltage of about 1 Vpp at a frequency band of about 1 kHz to 6 kHz was applied to the capacitor. In this state, acoustic noise was collected by a directional microphone disposed 3 mm above the multilayer ceramic capacitor of the sample S. Then, a maximum sound pressure level of the sound collected by a sound collecting meter and an FFT analyzer (CF-5220 manufactured by Ono Sokki Co., Ltd.) was measured.

Second Example

Aside from setting the following conditions, a capacitor mounting structure was manufactured and the sound pressure level of acoustic noise thereof was measured in the same manner as in the case of the first example.
Dimensions of the capacitor main body: L dimension was about 1.10 mm, W dimension was about 0.64 mm, and T dimension was about 0.82 mm.
t1: about 700 μm
t2: about 60 μm
t3: about 60 μm
w2: about 50 μm
w3: about 50 μm
Number of ceramic sections: 409
Electrostatic capacity: about 10 μF Third Example Aside from setting the following conditions, a capacitor mounting structure was manufactured and the sound pressure level of acoustic noise thereof was measured in the same manner as in the case of the first example.
Dimensions of the capacitor main body: L dimension was about 1.60 mm, W dimension was about 0.91 mm, and T dimension was about 1.11 mm.
t1: about 820 μm
t2: about 140 μm
t3: about 140 μm
w2: about 70 μm
w3: about 70 μm
Number of ceramic sections: 524
Electrostatic capacity: about 22 μF First Comparative Example A capacitor mounting structure was manufactured and the sound pressure of acoustic noise thereof was measured in the same manner as in the case of the first example, aside from that t2 and w2 were made equal to each other, and the T dimension was made smaller accordingly.

Second Comparative Example

A capacitor mounting structure was manufactured and the sound pressure of acoustic noise thereof was measured in the same manner as in the case of the second example, aside from that t2 and w2 were made equal to each other, and the T dimension was made smaller accordingly.

Third Comparative Example

A capacitor mounting structure was manufactured and the sound pressure of acoustic noise thereof was measured in the same manner as in the case of the third example, aside from that t2 and w2 were made equal to each other, and the T dimension was made smaller accordingly.
As a result, the sound pressure level of the capacitor in the first example was lower than that of the capacitor in the first comparative example by about 8.1 dB. The sound pressure level of the capacitor in the second example was lower than that of the capacitor in the second comparative example by about 9.1 dB. The sound pressure level of the capacitor in the third example was lower than that of the capacitor in the third comparative example by about 6.5 dB.

Next, in order to clarify the thickness dimension t2 of the second region and the thickness dimension t3 of the third region that make it possible to effectively reduce or prevent acoustic noise, the following experiments were carried out.

Fourth Comparative Example

Aside from setting the following conditions, a capacitor mounting structure was manufactured and the sound pressure level of acoustic noise thereof was measured in the same manner as in the case of the first example. The result is shown in Table 1.
Dimensions of the capacitor main body: L dimension was about 1.75 mm, W dimension was about 0.85 mm, and T dimension was about 0.85 mm.
t1: about 780 μm
t2: about 40 μm
t3: about 40 μm
t2/t1: about 0.05
t3/t1: about 0.05
w2: about 100 μm
w3: about 100 μm
Number of ceramic sections: 345
Electrostatic capacity: about 10 μF Fourth Example Aside from setting the following conditions, a capacitor mounting structure was manufactured and the sound pressure level of acoustic noise thereof was measured in the same manner as in the case of the fourth comparative example. The result is shown in Table 1.
t1: about 780 μm
t2: about 55 μm
t3: about 55 μm
t2/t1: about 0.07
t3/t1: about 0.07

Fifth Example

Aside from setting the following conditions, a capacitor mounting structure was manufactured and the sound pressure level of acoustic noise thereof was measured in the same manner as in the case of the fourth comparative example. The result is shown in Table 1.
t1: about 780 μm
t2: about 80 μm
t3: about 80 μm
t2/t1: about 0.1
t3/t1: about 0.1

Sixth Example

Aside from setting the following conditions, a capacitor mounting structure was manufactured and the sound pressure level of acoustic noise thereof was measured in the same manner as in the case of the fourth comparative example. The result is shown in Table 1.
t1: about 780 μm
t2: about 120 μm
t3: about 120 μm
t2/t1: about 0.15
t3/t1: about 0.15

Seventh Example

Aside from setting the following conditions, a capacitor mounting structure was manufactured and the sound pressure level of acoustic noise thereof was measured in the same manner as in the case of the fourth comparative example. The result is shown in Table 1.

t1: about 780 μm
t2: about 155 μm
t3: about 155 μm
t2/t1: about 0.2
t3/t1: about 0.2

TABLE 1

|  | t2/t1 | t3/t1 | SOUND PRESSURE (dB) |
|---|---|---|---|
| FOURTH COMPARATIVE EXAMPLE | 0.05 | 0.05 | 61.3 |
| FOURTH EXAMPLE | 0.07 | 0.07 | 59.6 |
| FIFTH EXAMPLE | 0.10 | 0.10 | 55.7 |
| SIXTH EXAMPLE | 0.15 | 0.15 | 52.3 |
| SEVENTH EXAMPLE | 0.20 | 0.20 | 50.2 |

It is understood from Table 1 that the sound pressure can be made to be no more than about 60 dB by making t2/t1 and t3/t1 no less than about 0.07, for example. Further, it is also understood that, by making t2/t1 and t3/t1 no less than about 0.15, the sound pressure is halved from about 60 dB, in other words, reduced by about −6 dB, that is, no more than about 54 dB, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A capacitor comprising:
    a capacitor main body including a first main surface and a second main surface which extend along a longitudinal direction and a width direction, a first side surface and a second side surface which extend along the longitudinal direction and a thickness direction, and a first end surface and a second end surface which extend along the width direction and the thickness direction; and
    a first inner electrode and a second inner electrode provided in the capacitor main body and opposing each other via a ceramic section; wherein
    the ceramic section includes ferroelectric ceramics;
    in the capacitor main body, a dimension along the thickness direction of a first region where the first and second inner electrodes are provided is t1;
    in the capacitor main body, a dimension along the thickness direction of a second region that is positioned on a side of the first main surface relative to the first region is t2;
    in the capacitor main body, a dimension along the thickness direction of a third region that is positioned on a side of the second main surface relative to the first region is t3;
    a condition of t2/t1>about 0.07 and a condition of t3/t1>about 0.07 are satisfied; and
    a distance along the width direction from a portion where both the first and second inner electrodes of the capacitor main body are provided to the first side surface is w2 and a distance along the width direction from a portion where both the first and second inner electrodes of the capacitor main body are provided to the second side surface is w3, and t2 and t3 are greater than w2 and w3, respectively;
    the first and second main surfaces have a different color depth than a color depth of the first and second side surfaces; and
    a belt-shaped pattern in the longitudinal direction is provided on the first and second side surfaces.

2. The capacitor according to claim 1, wherein a condition of about 2.0>t3/t2>about 0.5 is satisfied.

3. The capacitor according to claim 1, wherein t2 and t3 are equal or substantially equal to each other.

4. The capacitor according to claim 1, wherein the first inner electrode and the second inner electrode oppose each other in the thickness direction.

5. The capacitor according to claim 1, wherein a dimension of the capacitor main body along the longitudinal direction is about 0.6 mm to about 1.8 mm, a dimension of the capacitor main body along the width direction is about 0.3 mm to about 1.0 mm, and a dimension of the capacitor main body along the thickness direction is about 0.3 mm to about 1.2 mm.

6. The capacitor according to claim 1, wherein an electrostatic capacity of the capacitor is no less than about 1 μF and a thickness of the ceramic section is no more than about 1 μm.

7. The capacitor according to claim 1, wherein an electrostatic capacity of the capacitor is no less than about 10 μF and a thickness of the ceramic section is no more than about 1 μm.

8. The capacitor according to claim 1, wherein a dimension of the capacitor main body in the thickness direction is t0, and a condition t1/t0>about 0.6 and a condition of 1.2>t3/t2>about 0.8 are satisfied.

9. The capacitor according to claim 1, wherein a condition of t2/t1>0.15 and a condition of t3/t1>0.15 are satisfied.

10. The capacitor according to claim 1, wherein a condition of t2/t1>0.3 and a condition of t3/t1>0.3 are satisfied.

11. The capacitor according to claim 1, wherein a dimension of the capacitor main body along the width direction is w0, and w0 is about 0.9 to about 1.1 times to.

12. The capacitor according to claim 1, wherein t2 and t3 are greater than w2 and w3 by no less than about 10 μm, respectively.

13. The capacitor according to claim 1, wherein t2 and t3 are greater than w2 and w3 by no less than about 30 μm, respectively.

14. The capacitor according to claim 1, wherein at least one of w2 and w3 is no more than about 80 μm.

15. The capacitor according to claim 1, wherein at least one of w2 and w3 is no more than about 60 μm.

16. A capacitor mounting structure comprising:
    the capacitor according to claim 1; and
    a mounting board on which the capacitor is mounted; wherein
    the capacitor is mounted so that the second main surface opposes the mounting board.

17. A taped electronic component series comprising:
    the capacitor according to claim 1; and
    a tape including a plurality of recesses that are arranged along the longitudinal direction and in each of which the capacitor is accommodated; wherein
    the capacitor is disposed so that the second main surface opposes a bottom surface of the recess.

* * * * *